(12) United States Patent
Lv

(10) Patent No.: US 9,305,982 B2
(45) Date of Patent: Apr. 5, 2016

(54) LIQUID CRYSTAL PANEL AND MANUFACTURING METHOD OF THE LIQUID CRYSTAL PANEL

(71) Applicant: SHENZHEN CHINA STAR OPTOELECTRONICS TECHNOLOGY CO., LTD., Shenzhen, Guangdong (CN)

(72) Inventor: Qibiao Lv, Guangdong (CN)

(73) Assignee: SHENZHEN CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 220 days.

(21) Appl. No.: 14/235,794

(22) PCT Filed: Jan. 14, 2014

(86) PCT No.: PCT/CN2014/070609
§ 371 (c)(1),
(2) Date: Jan. 29, 2014

(87) PCT Pub. No.: WO2015/100801
PCT Pub. Date: Jul. 9, 2015

(65) Prior Publication Data
US 2015/0378202 A1    Dec. 31, 2015

(30) Foreign Application Priority Data
Dec. 31, 2013 (CN) .......................... 2013 1 0750577

(51) Int. Cl.
*H01L 33/00* (2010.01)
*H01L 21/00* (2006.01)
*H01L 27/32* (2006.01)
*G02F 1/1339* (2006.01)

(52) U.S. Cl.
CPC ........ *H01L 27/3232* (2013.01); *G02F 1/13394* (2013.01); *G02F 2001/13396* (2013.01)

(58) Field of Classification Search
CPC .................. H01L 27/3232; G02F 1/13394
USPC .................................. 438/29–31; 257/96–98
See application file for complete search history.

(56) References Cited

U.S. PATENT DOCUMENTS 6,057,896 A * 5/2000 Rho et al. ..................... 349/42

FOREIGN PATENT DOCUMENTS

EP            1912095      * 10/2007    ............ G02F 1/1362

* cited by examiner

*Primary Examiner* — Calvin Lee

(57) ABSTRACT

The present disclosure provides a liquid crystal panel, including: a first substrate and a second substrate opposite to the first substrate; a first optical spacer formed on one side of the first substrate facing the second substrate; a pad formed on one side of the second substrate facing the first substrate and corresponding to the first optical spacer; a TFT formed on the side of the second substrate facing the first substrate, being provided with a plurality of scanning lines and a plurality of data lines vertically intersecting with the scanning lines; and a second optical spacer and a third optical spacer formed on the side of the first substrate facing the second substrate, with the second optical spacer corresponding to two sides of the TFT along a direction of the scanning line.

15 Claims, 1 Drawing Sheet

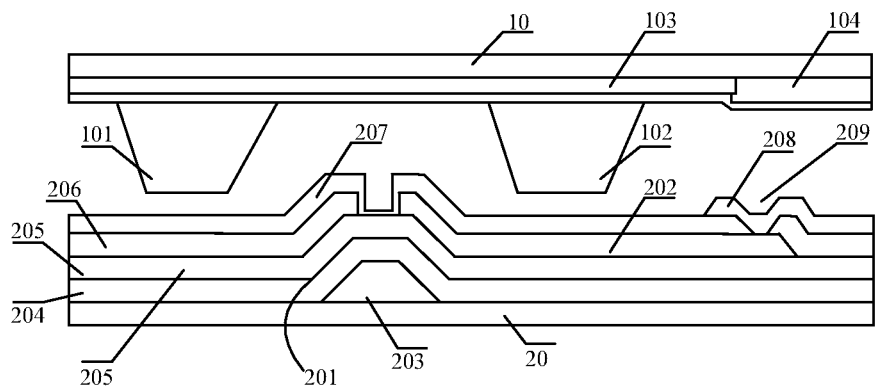

FIG. 1

```
┌─────────────────────────────────────────────┐
│  Providing a first substrate and forming a first optical      │─── S11
│  spacer, a second optical spacer, and a third optical spacer  │
│              on the first substrate                           │
└─────────────────────────────────────────────┘
                        │
                        ▼
┌─────────────────────────────────────────────┐
│  Providing a second substrate and forming a gate electrode,   │
│    a gate insulation layer, an active layer, a source/drain   │
│   electrode metal layer, and a passivation layer of a TFT on  │
│   the second substrate in this order, and forming a pad at a  │─── S12
│   position corresponding to the first optical spacer, with the│
│    second optical spacer corresponding to one side of the TFT │
│      along a direction of a scanning line of the liquid crystal│
│    panel and the third optical spacer corresponds to the other│
│     side of the TFT along the direction of the scanning line  │
└─────────────────────────────────────────────┘
                        │
                        ▼
┌─────────────────────────────────────────────┐
│ Defining a contact hole in the passivation layer and forming  │─── S13
│ a pixel electrode which is electrically connected to the drain│
│    electrode metal layer through the contact hole on the      │
│                     passivation layer                         │
└─────────────────────────────────────────────┘
                        │
                        ▼
┌─────────────────────────────────────────────┐
│   Pouring liquid crystals into a space between the first      │─── S14
│   substrate and the second substrate and bonding the first    │
│  substrate and the second substrate to form the liquid crystal│
│                         panel                                 │
└─────────────────────────────────────────────┘
```

FIG. 2

LIQUID CRYSTAL PANEL AND MANUFACTURING METHOD OF THE LIQUID CRYSTAL PANEL

BACKGROUND

1. Technical Field

The present disclosure generally relates to technologies of liquid displays, and more particularly, to a liquid crystal panel and a manufacturing method of the liquid crystal panel.

2. Description of Related Art

Displays become indispensable in people's daily life. Types of the displays include CRT (Cathode Ray Tube), LED (Light Emitting Diode), TFT-LCD (Thin Film Transistor-Liquid Crystal Display), PDP (Plasma Display Panel), etc. At present, most of the displays in the market are TFT-LCD displays.

A TFT-LCD display includes a color film substrate and an array substrate opposite to the color film substrate. The array substrate includes a circuit matrix (including scanning lines, data lines, etc.) formed on the substrate by an array process. The color film substrate includes a red, green, and blue color film and a black matrix formed on the substrate by a color filter process. The array substrate and the color film substrate then are aligned with each other and are bonded together by a bonding process. Liquid crystals are dropped into the space between the two substrates and a sealant is coated on the substrates for sealing the liquid crystal to form a cell. The two substrates become a final product (such as a TFT-LCD television or a TFT-LCD display) by subsequent processes.

However, as a size of the TFT-LCD display becomes greater and greater (generally greater than 32 itches), in the process of bonding the array substrate and the color film substrate, the substrate located at an upper position may be deformed and curved, causing the array substrate to be misaligned with the color film substrate. This may further cause the black matrix configured for blocking edge areas of the scanning lines to offset from its original position and not to block the edge areas of the scanning lines any more. In this case, light may leak from the edge areas of the scanning lines to seriously affect the displaying effect of the TFT-LCD display.

SUMMARY

The main object of the present disclosure is to provide a liquid crystal panel and a manufacturing method of the liquid crystal panel, for effectively preventing light from leaking from edge areas of scanning lines and improving the displaying effect of the liquid crystal panel.

The liquid crystal panel provided in an embodiment of the present disclosure includes: a first substrate and a second substrate opposite to the first substrate; a first optical spacer formed on one side of the first substrate facing the second substrate; a pad formed on one side of the second substrate facing the first substrate and corresponding to the first optical spacer; a TFT formed on the side of the second substrate facing the first substrate, being provided with a plurality of scanning lines and a plurality of data lines vertically intersecting with the scanning lines; and a second optical spacer and a third optical spacer formed on the side of the first substrate facing the second substrate, with the second optical spacer corresponding to one side of the TFT along a direction of the scanning line and the third optical spacer corresponding to the other side of the TFT along the direction of the scanning line.

Preferably, one end of the third optical spacer away from the first substrate is spaced from the second substrate.

Preferably, one side of the third optical spacer adjacent to the TFT is spaced from the TFT.

Preferably, a thickness of the first optical spacer is less than that of the second optical spacer, and the thickness of the second optical spacer is equal to that of the third optical spacer.

Preferably, the first substrate is a color film substrate, the second substrate is an array substrate, the TFT includes a gate insulation layer, an active layer, and a passivation layer formed on one side of the array substrate facing the color film substrate, and the pad includes one or more layers of material of the gate insulation layer, the active layer, or the passivation layer.

Preferably, the first substrate is a color film substrate, the second substrate is an array substrate, one side of the color film substrate facing the array substrate is provided with a black matrix, color resistors formed between the black matrix, and a common electrode covering the color resistors and the black matrix; and the first optical spacer, the second optical spacer, and the third optical spacer are formed on the common electrode.

Preferably, the first substrate is a color film substrate, the second substrate is an array substrate, the scanning lines and the data lines form a plurality of pixel units each which includes a pixel electrode connected to a drain electrode of the corresponding TFT.

The manufacturing method of the liquid crystal panel provided in an embodiment of the present disclosure includes:

providing a first substrate and forming a first optical spacer, a second optical spacer, and a third optical spacer on the first substrate;

providing a second substrate and forming a gate electrode, a gate insulation layer, an active layer, a source/gate electrode metal layer, and a passivation layer of a TFT on the second substrate, forming a pad corresponding to the first optical spacer, with the second optical spacer corresponding to one side of the TFT along a direction of a scanning line of the liquid crystal panel and the third optical spacer corresponding to the other side of the TFT along the direction of the scanning line;

defining a contact hole in the passivation layer and forming a pixel electrode electrically connected to the drain electrode metal layer through the contact hole on the passivation layer; and pouring liquid crystals into a space between the first substrate and the second substrate, and bonding the first substrate and the second substrate to form the liquid crystal panel.

Preferably, the step of providing a first substrate and forming a first optical spacer, a second optical spacer, and a third optical spacer on the first substrate includes:

providing the first substrate, forming the black matrix on the first substrate by a deposition and etching process, and forming the color resistors between the black matrix on the substrate;

forming the common electrode covering the color resistors and the black matrix; and forming the first optical spacer, the second optical spacer, and the third optical spacer on the common electrode.

Preferably, the first optical spacer, the second optical spacer, and the third optical spacer are simultaneously formed, a thickness of the first optical spacer is less than that of the second optical spacer, and the thickness of the second optical spacer is equal to that of the third optical spacer.

In the embodiment, the second optical spacer and the third optical spacer are formed corresponding to two sides of the TFT along the direction of the scanning line, and the second optical spacer and the third optical spacer cooperate with each other to form a slot with the TFT being clamped therein, thus, the substrate does not easily offset from its original position, which prevents light from leaking from edge areas of the scanning lines caused by the misalignment between the array substrate and the color film substrate due to large size of the liquid crystal panel and thus improves the displaying effect of the liquid crystal panel.

DESCRIPTION OF THE DRAWINGS

Many aspects of the embodiments can be better understood with reference to the following drawings. The components in the drawings are not necessarily dawns to scale, the emphasis instead being placed upon clearly illustrating the principles of the embodiments. Moreover, in the drawings, like reference numerals designate corresponding parts throughout the several views.

FIG. 1 is a schematic view of a liquid crystal panel in accordance with an embodiment of the present disclosure; and FIG. 2 is a flow chart of a manufacturing method of a liquid crystal panel in accordance with an embodiment of the present disclosure.

DETAILED DESCRIPTION

The disclosure is illustrated by way of example and not by way of limitation in the figures of the accompanying drawings in which like references indicate similar elements. It should be noted that references to "an" or "one" embodiment is this disclosure are not necessarily to the same embodiment, and such references mean at least one.

The present disclosure provides a liquid crystal panel, as shown in FIG. 1, including a first substrate 10 and a second substrate 20 opposite to the first substrate 10. A first optical spacer (not shown) is formed on one side of the first substrate 10 facing the second substrate 20, and a pad (not shown) corresponding to the first optical spacer is arranged on one side of the second substrate 20 facing the first substrate 10. A TFT 201 is formed on the side of the second substrate 20 facing the first substrate 10. The TFT 201 is provided with a number of vertically intersecting scanning lines and date lines (not shown). A second optical spacer 101 and a third optical spacer 102 are formed on the side of the first substrate 10 facing the second substrate 20, the second optical spacer 101 corresponds to one side of the TFT 201 along the direction of the scanning line, and the third optical spacer 102 corresponds to the other side of the TFT 201 along the direction of the scanning line.

In the embodiment, the first substrate 10 is a color film substrate, the second substrate 20 is an array substrate, and the liquid crystal panel further includes a liquid crystal layer arranged between the color film substrate 10 and the array substrate 20. The color film substrate 10 is further provided with a black matrix 103, color resistors 104 formed between the black matrix 103, and a common electrode 105 covering the color resistors 104 and the black matrix 103. The first optical spacer, the second optical spacer 101, and the third optical spacer 102 are formed on the common electrode 105.

The array substrate 20 forms a number of the scanning lines and a number of the data lines vertically intersecting the scanning lines to form a number of pixel units (not shown). The TFT 201 is formed at the intersection of one respective scanning line and the corresponding data line. Each pixel unit includes a pixel electrode 208 connected to a drain electrode 202 of the TFT 201. In the embodiment, the TFT 201 is bottom-gate structured, includes a gate electrode 203, a gate insulation layer 204, an active layer 205, a source electrode 206, the drain electrode 202, and a passivation layer 207 located on the array substrate 20 in this order. A contact hole 209 is defined in the passivation layer 207. The contact hole 209 runs through the passivation layer 207 to break the passivation layer 207 into two parts and connect the pixel electrode 208 and the drain electrode 202. The array substrate 20 is further provided with the pad located on the gate insulation layer 204. The pad corresponds to the first optical spacer on the color film substrate 10 and contacts the first optical spacer. The pad engages with the first optical spacer on the color film substrate 10 for supporting a first cell gap of the liquid crystal panel under no outer forces.

The liquid crystal panel includes a display area and a non-display area (not shown). The black matrix 103 is used for blocking the non-display area, for example, the TFT 201. The color resistors 104 respectively correspond to the pixel units on the array substrate 20. The color resistors 104 include red color resistors, green color resistors, and blue color resistors (not respectively shown) which engage with corresponding pixel units to define a to-be-displayed color. The common electrode 105 and the pixel electrode 208 are transparent electrodes. The liquid crystal layer is arranged between the common electrode 105 and the pixel electrode 208. In the displaying process of the liquid crystal panel, a common voltage is applied to the common electrode 105, pixel voltages are applied to the pixel units, and the common electrode 105 engages with a plurality of the pixel electrodes 208 to control rotations of liquid crystal molecules located between the common electrode 105 and the pixel electrodes 208 and thus to define the to-be-displayed color.

In order to improve conductivities of the common electrode 105 and the pixel electrodes 208, the common electrode 105 and the pixel electrodes 208 are made of indium tin oxide (ITO). In other embodiments, the common electrode 105 and the pixel electrodes 208 can be made of other conductive material.

The second optical spacer 101 corresponds to one side of the TFT 201 along the direction of the scanning line, and the third optical spacer 102 corresponds to the other side of the TFT 201 along the direction of the scanning line. That is, the second optical spacer 101 and the third optical spacer 102 respectively correspond to two sides of the TFT 201 along the direction of the scanning line and the TFT 201 is located between the second optical spacer 101 and the third optical spacer 102. The second optical spacer 101 and the third optical spacer 102 protrude from the color film substrate 10 and respectively have a predetermined thickness, thus, the second optical spacer 101 is capable of cooperating with the third optical spacer 102 to form a slot with the TFT 201 being clamped therein. Ends of the second optical spacer 101 and the third optical spacer 102 which are away from the color film substrate 10 are spaced from the array substrate 20, thus, when the liquid crystal panel is pressed and deformed under an outer force, or, when the substrate is deformed for the large size of the liquid crystal panel, the second optical spacer 101 and/or the third optical spacer 102 abut the array substrate 20 to keep a second cell gap of the liquid crystal panel.

In the embodiment, the second optical spacer 101 and the third optical spacer 102 are formed corresponding to two sides of the TFT 201 along the direction of the scanning line, and the second optical spacer 101 and the third optical spacer 102 cooperate with each other to form a slot with the TFT 201 being clamped therein, thus, the substrate does not easily offset from its original position, which prevents light from leaking from edge areas of the scanning lines caused by the misalignment between the array substrate 20 and the color film substrate 10 due to the large size of the liquid crystal panel and thus improves the displaying effect of the liquid crystal panel.

Furthermore, in order to simplify the process and accelerate the manufacture of the liquid crystal panel, the second optical spacer 101 and the third optical spacer 102 are simultaneously formed, and a thickness of the second optical spacer 101 is equal to that of the third optical spacer 102. That is, the distance between one end of the second optical spacer 101 away from the color film substrate 10 and the array substrate 20 is equal to the distance between one end of the third optical spacer 102 away from the color film substrate 10 and the array substrate 20. However, the present disclosure is not limited to the embodiment. In order to simplify the process and accelerate the manufacture of the liquid crystal panel, the first optical spacer, the second optical spacer, and the third optical spacer are simultaneously formed. A thickness of the first optical spacer is less than that of the second optical spacer 101. However, the present disclosure is not limited to this embodiment.

Furthermore, in order to simplify the process, the pad includes one or more layers of the material of the gate insulation layer 204, the active layer 205, or the passivation layer 207. That is, the pad is simultaneously formed with the one or more layers of the material of the gate insulation layer, the active layer, or the passivation layer.

Referring to FIG. 2, which is a flow chart of a manufacturing method of a liquid crystal panel in accordance with a first embodiment of the present disclosure, the manufacturing method of the liquid crystal panel includes the following steps.

Step S11, providing a first substrate and forming a first optical spacer, a second optical spacer, and a third optical spacer on the first substrate.

Step S12, providing a second substrate and forming a gate electrode, a gate insulation layer, an active layer, a source/drain electrode metal layer, and a passivation layer of a TFT on the second substrate in this order, and forming a pad at a position corresponding to the first optical spacer, with the second optical spacer corresponding to one side of the TFT along a direction of a scanning line of the liquid crystal panel, and the third optical spacer corresponding to the other side of the TFT along the direction of the scanning line.

Step S13, defining a contact hole in the passivation layer and forming a pixel electrode which is electrically connected to the drain electrode metal layer through the contact hole on the passivation layer.

Step S14, pouring liquid crystals into a space between the first substrate and the second substrate and bonding the first substrate and the second substrate to form the liquid crystal panel.

In the embodiment, step S11 specifically includes: providing the first substrate, forming a black matrix on the first substrate by a deposition and etching process, forming color resistors including but not limited to red color resistors, green color resistors, and blue color resistors between the black matrix; forming a common electrode covering the color resistors and the black matrix, and forming the first optical spacer, the second optical spacer, and the third optical spacer on the common electrode. Step S12 specifically includes: providing the second substrate, forming the gate electrode, the gate insulation layer, the active layer, the source/drain electrode metal layer, and the passivation layer of the TFT on the second substrate in this order, with one side of the TFT along a direction of a scan line of the liquid crystal panel corresponding to the second optical spacer and the other end of the TFT along the direction of the scan line corresponding to the third optical spacer; meanwhile, forming the pad at the position corresponding to the first optical spacer; and defining the contact hole in the passivation layer and forming the pixel electrode which is electrically connected to the drain electrode metal layer through the contact hole on the passivation layer. After the first substrate and the second substrate are formed according to the above method, liquid crystals are poured into the space between the first substrate and the second substrate, and the first substrate and the second substrate are thereafter bonded together to form the liquid crystal panel.

The second substrate forms a number of the scanning lines and a number of data lines vertically intersecting the scanning lines to form a number of pixel units (not shown). The TFT is formed at the intersection of one respective scanning line and the corresponding data line. Each pixel unit includes the pixel electrode connected to a drain electrode of the TFT. In the embodiment, the TFT is bottom-gate structured, includes the gate electrode, the gate insulation layer, the active layer, the source electrode, the drain electrode, and the passivation layer located on the second substrate in this order. The contact hole is defined in the passivation layer. The contact hole runs through the passivation layer to break the passivation layer into two parts and connects the pixel electrode and the drain electrode. The second substrate is further provided with the pad located on the gate insulation layer. The pad corresponds to the first optical spacer on the first substrate and contacts the first optical spacer. The pad engages with the first optical spacer on the first substrate for supporting a first cell gap of the liquid crystal panel under no outer forces.

The liquid crystal panel includes a display area and a non-display area (not shown). The black matrix is used for blocking the non-display area, for example, blocking the TFT. The color resistors respectively correspond to the pixel units on the second substrate. The color resistors include red color resistors, green color resistors, and blue color resistors which engage with corresponding pixel units to define a to-be-displayed color. The common electrode and the pixel electrode are transparent electrodes. The liquid crystal layer is located between the common electrode and the pixel electrode. In the displaying process of the liquid crystal panel, a common voltage is applied to the common electrode, pixel voltages are applied to the pixel units, and the common electrode engages with a plurality of the pixel electrodes to control rotations of liquid crystal molecules located between the common electrode and the pixel electrodes and thus to display the corresponding color.

In order to improve conductivities of the common electrode and the pixel electrodes, the common electrode and the pixel electrodes are made of indium tin oxide (ITO). In other embodiments, the common electrode and the pixel electrodes can be made of other conductive material.

The second optical spacer corresponds to one side of the TFT along the direction of the scanning line, and the third optical spacer corresponds to the other side of the TFT 201 along the direction of the scanning line. That is, the second optical spacer and the third optical spacer respectively correspond to two sides of the TFT along the direction of the scanning line and the TFT is located between the second optical spacer and the third optical spacer. The second optical spacer and the third optical spacer protrude from the first substrate and respectively have a predetermined thickness, thus, the second optical spacer is capable of cooperating with the third optical spacer to form a slot with the TFT being clamped therein. Ends of the second optical spacer and the third optical spacer which are away from the first substrate are spaced from the second substrate, thus, when the liquid crystal panel is pressed and deformed under an outer force, or, when the substrate is deformed for the large size of the liquid crystal panel, the second optical spacer and/or the third optical spacer abut the second substrate to keep a second cell gap of the liquid crystal panel.

In the embodiment, the second optical spacer and the third optical spacer are formed corresponding to two sides of the TFT along the direction of the scanning line, and the second optical spacer and the third optical spacer form a slot with the TFT being clamped therein, thus, the substrate does not offset from its original position easily, which prevents light from leaking from edge areas of the scanning lines caused by the misalignment between the first substrate and the second substrate due to the large size of the liquid crystal panel and thus improves the displaying effect of the liquid crystal panel.

Furthermore, in order to simplify the process and accelerate the manufacture of the liquid crystal panel, the second optical spacer and the third optical spacer are simultaneously formed, and the thickness of the second optical spacer is equal to that of the third optical spacer. That is, the distance between one end of the second optical spacer away from the first substrate and the second substrate is equal to the distance between one end of the third optical spacer away from the first substrate and the second substrate. However, the present disclosure is not limited to the embodiment. In order to simplify the process and accelerate the manufacture of the liquid crystal panel, the first optical spacer, the second optical spacer, and the third optical spacer are simultaneously formed. A thickness of the first optical spacer is less than that of the second optical spacer. However, the present disclosure is not limited to this embodiment.

Furthermore, in order to simplify the process, the pad includes one or more layers of the material of the gate insulation layer, the active layer, or the passivation layer. That is, the pad is simultaneously formed with the one or more layers of the material of the gate insulation layer, the active layer, or the passivation layer.

Even though information and the advantages of the present embodiments have been set forth in the foregoing description, together with details of the mechanisms and functions of the present embodiments, the disclosure is illustrative only; and that changes may be made in detail, especially in matters of shape, size, and arrangement of parts within the principles of the present embodiments to the full extend indicated by the broad general meaning of the terms in which the appended claims are expressed.

What is claimed is:

1. A liquid crystal panel, comprising:
   a first substrate and a second substrate opposite to the first substrate; a first optical spacer formed on one side of the first substrate facing the second substrate;
   a pad formed on one side of the second substrate facing the first substrate and corresponding to the first optical spacer;
   a TFT formed on the side of the second substrate facing the first substrate, being provided with a plurality of scanning lines and a plurality of data lines vertically intersecting with the scanning lines; and
   a second optical spacer and a third optical spacer formed on the side of the first substrate facing the second substrate, with the second optical spacer corresponding to one side of the TFT along a direction of the scanning line and the third optical spacer corresponding to the other side of the TFT along the direction of the scanning line.

2. The liquid crystal panel of claim 1, wherein a thickness of the first optical spacer is less than that of the second optical spacer, and the thickness of the second optical spacer is equal to that of the third optical spacer.

3. The liquid crystal panel of claim 1, wherein the first substrate is a color film substrate, the second substrate is an array substrate, the TFT comprises a gate insulation layer, an active layer, and a passivation layer formed on one side of the array substrate facing the color film substrate, and the pad comprises one or more layers of material of the gate insulation layer, the active layer, or the passivation layer.

4. The liquid crystal panel of claim 1, wherein the first substrate is a color film substrate, the second substrate is an array substrate, one side of the color film substrate facing the array substrate is provided with a black matrix, color resistors formed between the black matrix, and a common electrode covering the color resistors and the black matrix; and the first optical spacer, the second optical spacer, and the third optical spacer are formed on the common electrode.

5. The liquid crystal panel of claim 1, wherein the first substrate is a color film substrate, the second substrate is an array substrate, the scanning lines and the data lines form a plurality of pixel units each which comprises a pixel electrode connected to a drain electrode of the corresponding TFT.

6. The liquid crystal panel of claim 1, wherein one side of the third optical spacer adjacent to the TFT is spaced from the TFT.

7. The liquid crystal panel of claim 6, wherein a thickness of the first optical spacer is less than that of the second optical spacer, and the thickness of the second optical spacer is equal to that of the third optical spacer.

8. The liquid crystal panel of claim 6, wherein the first substrate is a color film substrate, the second substrate is an array substrate, the TFT comprises a gate insulation layer, an active layer, and a passivation layer formed on one side of the array substrate facing the color film substrate, and the pad comprises one or more layers of material of the gate insulation layer, the active layer, or the passivation layer.

9. The liquid crystal panel of claim 6, wherein the first substrate is a color film substrate, the second substrate is an array substrate, one side of the color film substrate facing the array substrate is provided with a black matrix, color resistors formed between the black matrix, and a common electrode covering the color resistors and the black matrix; and the first optical spacer, the second optical spacer, and the third optical spacer are formed on the common electrode.

10. The liquid crystal panel of claim 6, wherein the first substrate is a color film substrate, the second substrate is an array substrate, the scanning lines and the data lines form a plurality of pixel units each which comprises a pixel electrode connected to a drain electrode of the corresponding TFT.

11. The liquid crystal panel of claim 1, wherein one end of the third optical spacer away from the first substrate is spaced from the second substrate.

12. The liquid crystal panel of claim 11, wherein a thickness of the first optical spacer is less than that of the second optical spacer, and the thickness of the second optical spacer is equal to that of the third optical spacer.

13. The liquid crystal panel of claim 11, wherein the first substrate is a color film substrate, the second substrate is an array substrate, the TFT comprises a gate insulation layer, an active layer, and a passivation layer formed on one side of the array substrate facing the color film substrate, and the pad comprises one or more layers of material of the gate insulation layer, the active layer, or the passivation layer.

14. The liquid crystal panel of claim 11, wherein the first substrate is a color film substrate, the second substrate is an array substrate, one side of the color film substrate facing the array substrate is provided with a black matrix, color resistors formed between the black matrix, and a common electrode covering the color resistors and the black matrix; and the first optical spacer, the second optical spacer, and the third optical spacer are formed on the common electrode.

15. The liquid crystal panel of claim 11, wherein the first substrate is a color film substrate, the second substrate is an array substrate, and the scanning lines and the data lines form a plurality of pixel units each which comprises a pixel electrode connected to a drain electrode of the corresponding TFT.

\* \* \* \* \*